United States Patent [19]

Bricaud et al.

[11] Patent Number: 4,598,965
[45] Date of Patent: Jul. 8, 1986

[54] CONNECTOR AND CLOSURE CLIP FOR A RECTANGULAR CIRCUIT SUPPORT

[75] Inventors: Hervé Bricaud, Plaisir; Jean C. Rouffy, Poissy; Patrick L'Henaff, Thiais, all of France

[73] Assignee: Socapex, Sureness, France

[21] Appl. No.: 668,959

[22] Filed: Nov. 7, 1984

[30] Foreign Application Priority Data

Nov. 10, 1983 [FR] France .................. 83 17912

[51] Int. Cl.[4] .............................. H01R 9/09
[52] U.S. Cl. ..................... 339/75 MP; 339/17 CF
[58] Field of Search .......... 339/17 CF, 75 M, 75 MP

[56] References Cited

U.S. PATENT DOCUMENTS

| 4,063,791 | 12/1977 | Cutchaw | 339/17 CF |
|---|---|---|---|
| 4,172,626 | 10/1979 | Olsson | 339/17 F |
| 4,235,500 | 11/1980 | Belopavlovich et al. | 339/176 MF |
| 4,390,220 | 6/1983 | Benasutti | 339/17 CF |
| 4,427,249 | 1/1984 | Bright et al. | 339/17 CF |
| 4,498,721 | 2/1985 | van Dijk | 339/17 CF |
| 4,502,747 | 3/1985 | Bright et al. | 339/17 CF |
| 4,506,938 | 3/1985 | Madden | 339/17 CF |

FOREIGN PATENT DOCUMENTS

| 118346 | 9/1984 | European Pat. Off. . |
| 2539379 | 3/1977 | Fed. Rep. of Germany . |
| 935565 | 8/1963 | United Kingdom . |

OTHER PUBLICATIONS

MIL-S-38533 (USAF), p. 15, FIG. 5.

Primary Examiner—John McQuade
Attorney, Agent, or Firm—Cushman, Darby & Cushman

[57] ABSTRACT

A zero insertion force connector for a rectangular chip carrier and a closure clip for such a connector, comprising on the one hand a rectangular base and on the other a clip formed by a rectangular frame coming to bear on the upper part of the carrier, said clip being fixed to said base by hooks disposed at the four corners of the rectangular frame and cooperating with corresponding housings in the base. Said clip further comprises at least two oppositely disposed bearing arms connected together by two cross arms, each bearing arm comprising substantially in the middle thereof a bearing zone to which are connected two symmetrical half arms forming a V in the free condition, the ends of said half arms situated in the vicinity of said hooks being at a level higher than the bearing zone when said clip is in the free condition and substantially at the same level thereas when it is fixed to said base.

9 Claims, 9 Drawing Figures

FIG_1-A
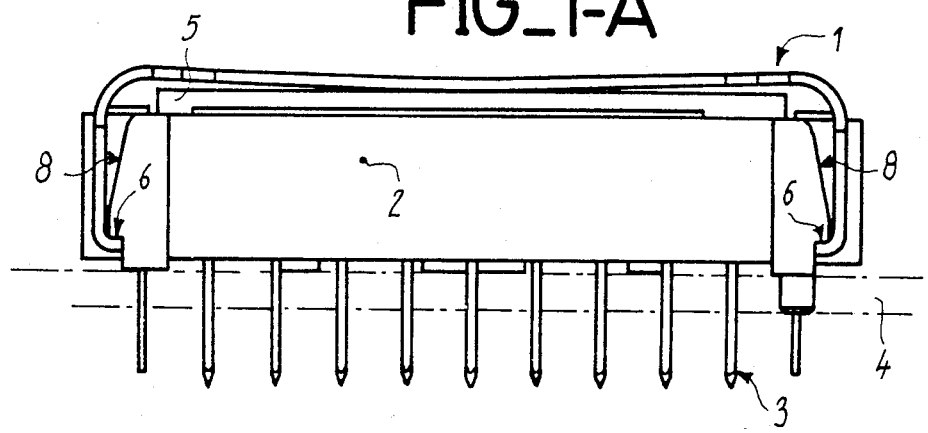
FIG_1-B
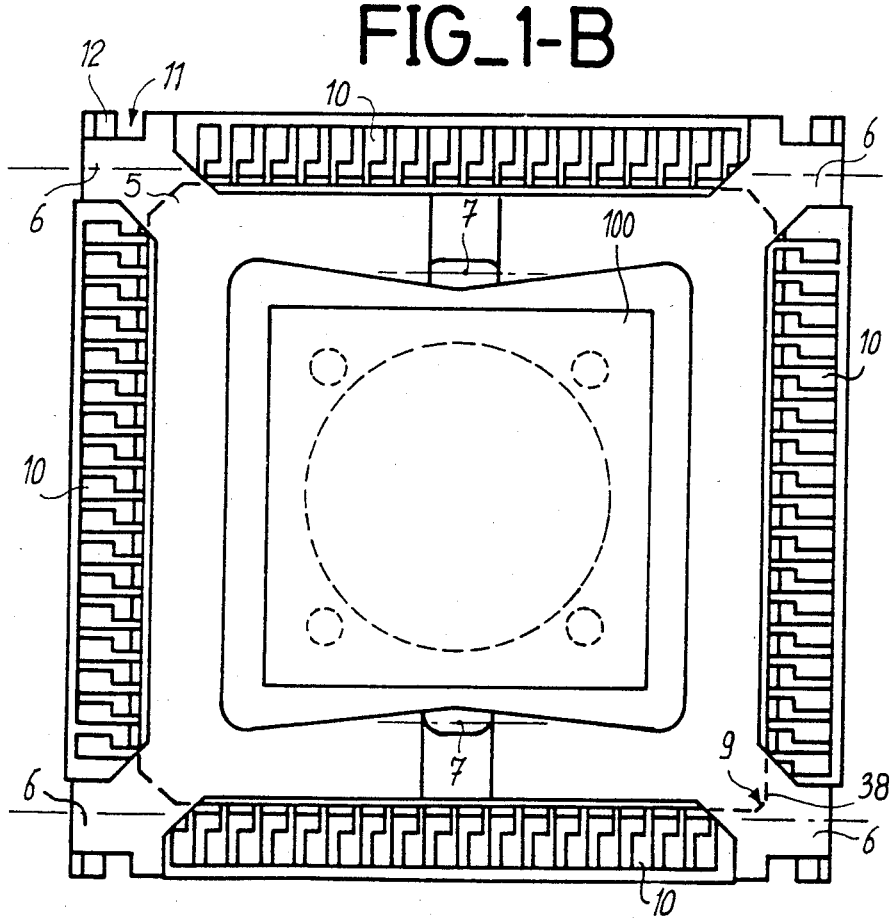

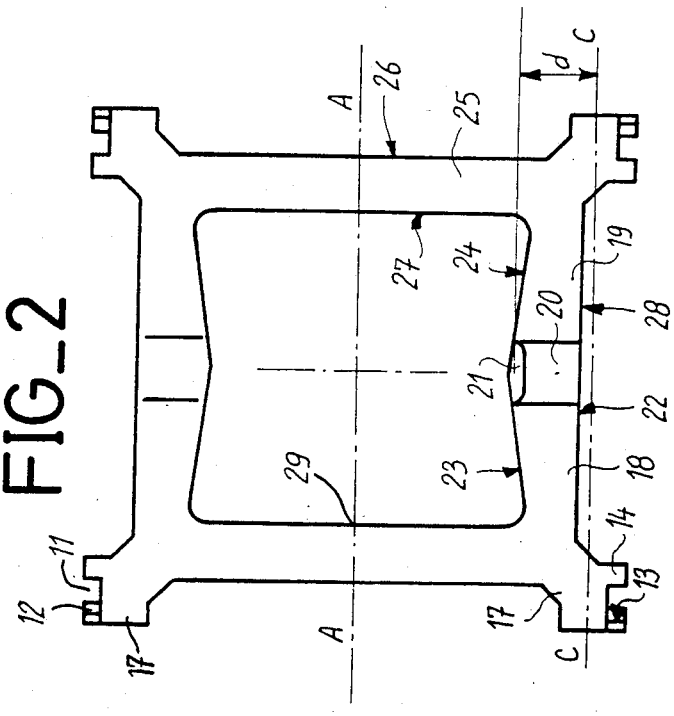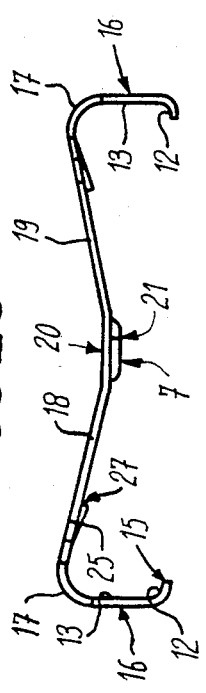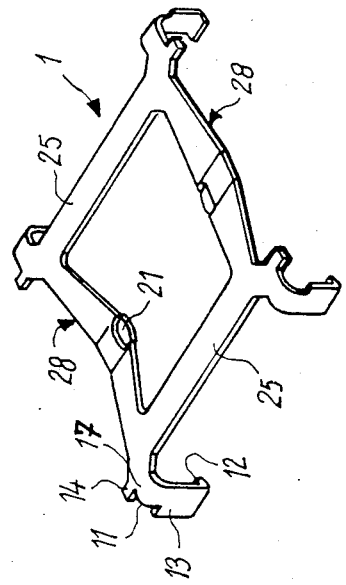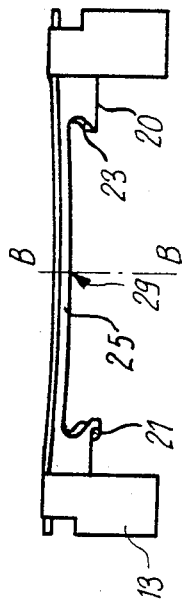

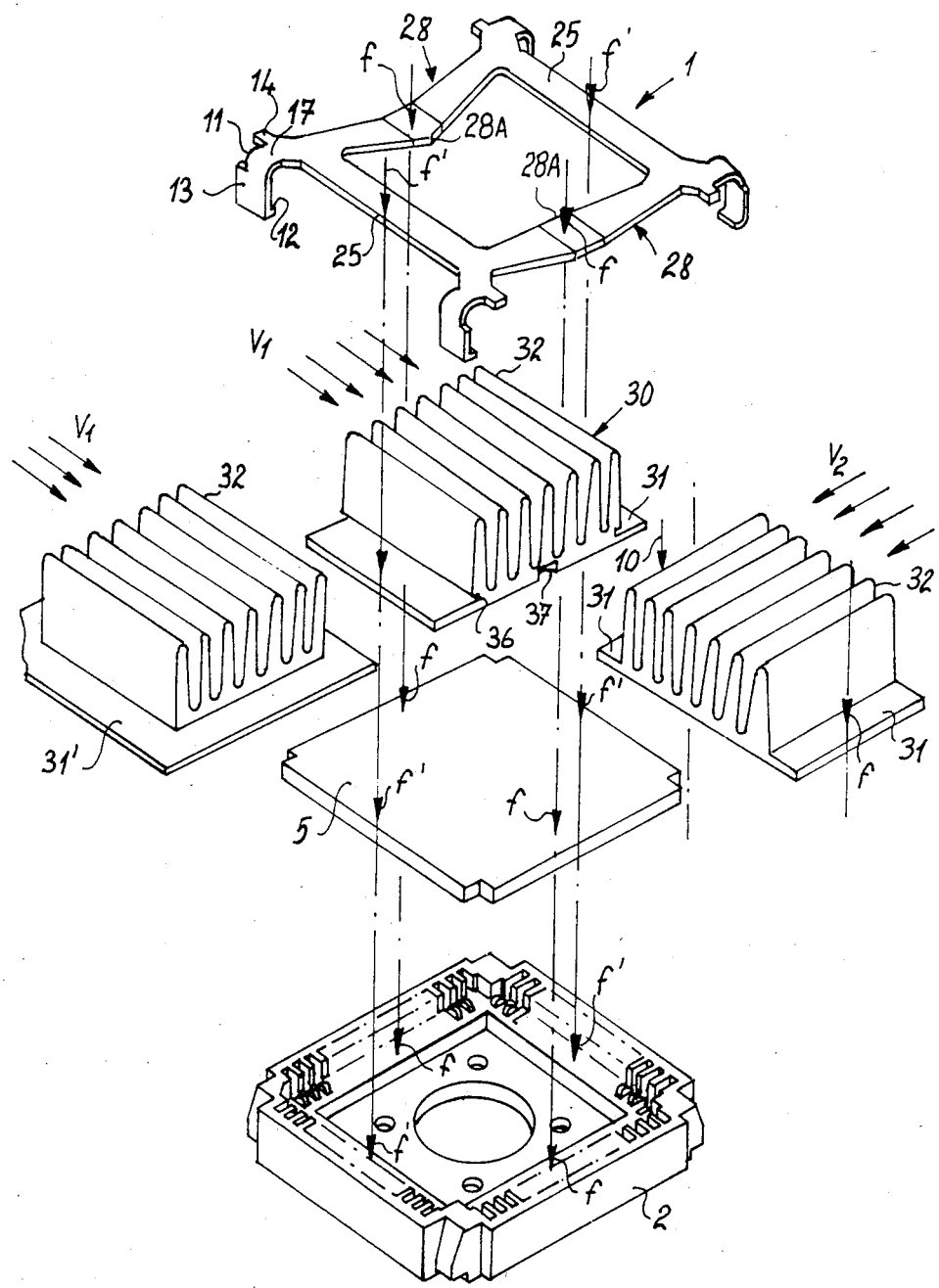
FIG_6

FIG_7
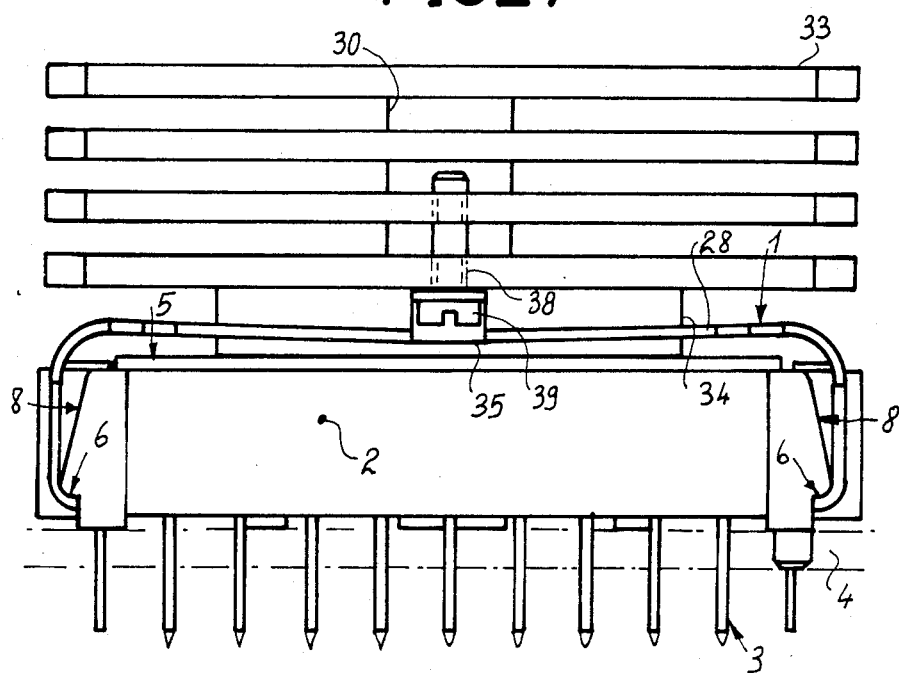
FIG_8
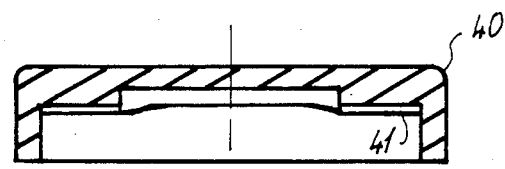

CONNECTOR AND CLOSURE CLIP FOR A RECTANGULAR CIRCUIT SUPPORT

BACKGROUND OF THE INVENTION

1. Field of the Invention

The present invention relates to a zero insertion force connector for a rectangular circuit support having contact zones disposed on one at least of its two faces, comprising a rectangular base with flexible contacts on which the corresponding contact zones of the lower face of the support come to bear and a clip formed from a rectangular frame applied to the upper part of the support, so as to maintain the electric continuity between the contact zones and the flexible contacts, said clip being fixed to the base by hooks disposed at the four corners of the rectangular frame and cooperating with corresponding housings in the base. The invention also relates to a clip such as defined above.

2. Description of the Prior Art

Such a type of connector as well as the clip adapted for fixing to the base thereof is described in the American standard MIL S 38 533. Reference may also be made to French application n°83 03 131 entitled "Connector comprising at least one contact with resiliently deformable arm" filed on the 25th of February 1983 in the name of the applicant and the description of which is incorporated in the present application by reference.

This type of connector is a zero insertion force connector, that is to say that the circuit support or "chip carrier" is positioned without insertion force on a rectangular base having rows of flexible contacts. After insertion of the chip carrier, the carrier is closed by locking the clip to the base.

At the present time, chip carriers are being developed comprising, on the one hand, peripheral connections disposed on the lower face and, on the other hand, at least one row of peripheral connections disposed on the upper face of the chip carrier. The presence of connections on the upper face of the chip carrier allows the semi conductor chip to be fixed directly thereto.

The clip such as defined in this MIL standard comprises a rectangular frame formed of four orthogonal arms, said arms being situated in the same plane and being extended in the connecting corners by hooks adapted for engagement in corresponding housings in the base.

Such an arrangement implies that, when the chip carrier comprises a row of peripheral connections on its lower face, the metal frame used for the clip causes short circuits between the different contacts of the upper face of the chip carrier. In addition, the embodiments at present available on the market, because of their structure are space consuming which means that they do not comply with the above mentioned standard.

SUMMARY OF THE INVENTION

The invention overcomes the disadvantages met with in the prior art.

For this, the connector of the invention provides a clip comprising at least two oppositely disposed support arms connected together by two cross arms, each support arm comprising substantially in the middle thereof a support zone to which are connected two symmetrical half areas forming a V in the free condition, the ends of the said half arms situated in the vicinity of the hooks being at a level higher than the bearing zone when the clip is in the free condition and substantially at the same level thereas when the clip is fixed to the base.

Preferably, the half arms have a shape of equal resistance, which generally results in the half arms being wider in the vicinity of the bearing zone than in the vicinity of the hooks.

According to a preferred embodiment of the invention, the bearing zone is formed by a projection situated on the integral edge of the bearing zone of the corresponding bearing arm allowing a bearing force of the clip on the support greater than that of the contacts of the base on said support, the edge thereof coming into abutment against the lower bearing platform of the cavity of the base.

Preferably, one at least of the hooks, which are formed by a first portion situated in the extension of the half arms, a second portion substantially orthogonal to the second one and a third portion substantially orthogonal to the second one and cooperating with a housing in the base for holding the clip closed, comprises a stud in the extension of the first portion forming an opening between the second portion and the stud for introducing therein a flat tool coming into abutment against the third portion, opening of the hook being achieved with the help of the flat tool bearing on the stud after introduction thereof into the opening.

In a preferred embodiment of the connector of the invention, the cross arms of the clip have a curved shape, in the same direction as the bearing arms, the internal edge of said arms, when the clip is in the free condition, being at a level less than that of the outer edge of the corresponding arm.

The above-described clip may also be used for fixing, directly on the upper face of the chip-carrier, a cooling device such as a finned heat-sink or a cooling block using circulation of a heat-carrying fluid. When the cooling device is formed by a heat-sink comprising essentially vertical fins and two horizontal fixing flanges, the clip of the present invention allows a single type of heat-sink to be used, whatever the blowing direction, the cross arms and the support arms serving respectively as means for locking the heat-sink on the chip-carrier, depending on the blowing direction. Furthermore, the heat-sink is, in this case, directly in contact with the upper face of the chip-carrier, without use of adhesive and insulating joint as with the connectors of the prior art. Thus, a better heat distribution between the heat-sink and the chip-carrier is obtained. Moreover, reliable locking is obtained without problems of thermo-mechanical stresses generated by the differences in heat expansion coefficient between the alumina and the aluminum of the heat-sink (relation >4 between the two).

In another embodiment, each support arm comprises on the external edge of the support zone, a stud for fixing a cooling device. In this case, the cooling device is preferably formed by a heat-sink with horizontal fins extended by a base dimensioned so as to be able to fit into the central opening of the clip. With this type of heatsink, the blowing direction has no longer to be taken into account. On the other hand, the size of the fins is not limited to the central opening of the clip, since only the base of the radiator must pass through the central opening.

Preferably, the base comprises at the four corners portions in relief situated within the outer periphery of the base and having a ramp over which the corresponding hook of the clip slides during clip-base coupling, said ramp ending in a flat portion on which the third portion of the corresponding hook is adapted to bear.

Because of the special form of the base, it is possible to use a device for manual or automatic snap-fitting of the clip on the base. This device is formed by a lid of parallelepipedic shape for fitting on the base, said lid comprising inwardly at the corners bosses coming into abutment against the fourangles of the clip during snap-fitting. With this snap-fitting device, a perpendicular and uniform pressure is therefore exerted on the four angles of the clip. In a variant, the bottom of the lid has a central opening for passing the cooling device therethrough.

BRIEF DESCRIPTION OF THE DRAWINGS

The invention will be better understood from the following description of embodiments, given by way of non limitative examples, with reference to the drawings in which:

FIGS. 1A and 1B are respectively a side view and a top view of the connector of the invention; and FIG. 2 is a front view of the clip of the connector of the invention;

FIG. 3 is a lateral view of the clip of the connector of the invention;

FIG. 4 is a perspective view of the clip of the connector of the invention;

FIG. 5 is a lateral view of another side of the clip of the connector of the invention;

FIG. 6, an exploded view of the connector of the invention, when a heat-sink with vertical fins is locked by means of the clip;

FIG. 7, a view of a connector according to the invention using a modified clip for receiving a heat-sink with horizontal fins; and FIG. 8, a device for automatic snap-fitting of the clip on the base.

DESCRIPTION OF THE PREFERRED EMBODIMENTS

FIGS. 1a and 1b show respectively a side view and a top view of the connector of the invention, in closure relation with a chip carrier 5. This latter is positioned, without insertion force, in bearing relation on the row of perimetric contacts 3 in base 2 of the connector. The body, molded from a plastic material, of base 2 has a cavity whose internal contour matches the external contour of the chip carrier 5. During positioning of chip carrier 5 in base 2, the respective foolproof fitting corners 38 and 9 must be brought into correspondance. (the lower bearing platform of the cavity of the base is not shown in the FIG. 1-B). The connector is then closed by locking clip 1 to base 2. This locking is achieved by exerting a pressure on the four corners of clip 1. Under this pressure, the catches 15 (or third portion) of hook 16 (see FIGS. 2 to 5) of the clip slide over guide slopes 8 on the base until the catches 15 engage in the corresponding flat housings in base 2. During the locking operation, the bearing arms 28 of the clip are resiliently deformed by exerting a bearing force on the chip carrier; under the action of this bearing force, the chip carrier is pushed into the internal cavity of the base while resiliently deforming the contacts 3 of the base until the chip carrier abuts against the lower bearing platform of the cavity. For more details about the base of such a connector and the contacts usable, reference may be made ot the French patent application No. 83 03 131 mentioned above, whose description is incorporated in the present application.

The form and structure of clip 1 have been determined so that, after engagement, the bearing force exerted by the clip on the chip carrier is equal to or greater than the sum of the bearing forces of the assembly of contacts 3.

Moreover, after locking, the clip must allow access to the rear 10 of the contacts for a possible electric operating test. Finally, it must have a central opening sufficiently wide to allow, if need be, insertion of a heat-sink snap-fitted or fixed directly to the chip carrier and shown schematically by the contour 100 as will be explained in greater detail hereafter. An example of a clip usable in a connector in accordance with the invention will now be described with reference to FIGS. 2 to 5. The clip has a substantially rectangular frame formed of four orthogonal arms, two bearing arms 28 and two cross arms 25. The bearing arms 28 have in the middle a bearing zone 20, at the level of which are connected the two symmetrical half arms 18 and 19 while forming in the free condition an open V forming an angle of about 155°. The half arms 18 and 19 preferably have a "equal resistance" form, that is to say that their width decreases linearly from the bearing zone 20 to the end thereof. The V shape of the bearing arms is favorable to a minimum height requirement of the connector: in fact, in the locked condition, because of the resilient deformation of the bearing arms, the angle of the V is close to 180° (slightly less), which reduces its height requirement to a value close to its thickness (see profile view, FIG. 1a). Moreover, the variations of thickness due to the manufacturing tolerance of the chip carrier are absorbed by a more or less pronounced resilient deformation of the V shape of the bearing arms; and the total height requirement of the connector is constant since it is defined by the tops of the rounded portions 17 (or first portion of the hooks 16) of the clip 1.

The bearing face 7 is preferably formed by a projection 21 of the bearing zone 20 as shown in FIG. 3 offset on the same side as the internal edges 23 and 24 of the bearing arms. (A single projection is shown in FIG. 2, the upper arm of the clip being without projection according to a variant). This projection 21 may be obtained by stamping in the form of a boss, or by welding or bonding a complementary part, possibly electrically insulating to the central flat zone 20 (or bearing zone) on the bearing arm 28. The offset of the bearing point creates a twisting phenomenon of the bearing arm 28 which results in reinforcing the bearing force already due to the bending of the bearing arm 28. Moreover, this offset also allows a chip carrier to be locked having at least one row of perimetric connections on its upper face, without short circuiting several of these studs.

The cross arms 25 serve as cross piece between the two bearing arms 28. However, when the bearing point 7 of the bearing arms 28 is offset, they exert the required reaction to the twisting torque undergone by the bearing arms 28 and thus share in the total bearing force of clip 1 on chip carrier 5; it is then advantageous to give the cross arms 25 a curved, bowed, shape during manufacture thereof, so that their deformed shape does not add to the total height requirement of the locked connector.

The hooks 16 of the clip are connected to the four corners of the frame, in the extension of the bearing arms 28 through rounded portions 17. During locking, the opening of the V of the bearing arm 28 tends to close the hooks again inwardly of the housings of the base: this phenomenon contributes to good engagement of the catches 15 in these housings. For unlocking no specific tool is required: it is sufficient for instance to introduce a screw driver blade through the opening 11 until the end of the blade comes into abutment against the arresting face 12 of the hook and to exert a pressure on the buttressing face 13 (or second portion of hook 16) using stud 14 as fulcrum. The rounded connecting portions 17 provide the resilient required for freeing catch 15 from its housing. The arresting face 12 is a safety element which prevents the screw driver blade from slipping and damaging the tracks of the electronic blade 4, situated under the connector during unlocking.

In the locked position, hooks 16 are preferably slightly set back inside the housings of the base (See FIG. 1a). Thus, hooks 16 do not project from the maximum space required by base 2 when catches 15 are freed from their housing or locking the clip, and it is thus possible to equip the electronic card 4 with several connectors mounted in mutual engagement on all the sides.

In FIG. 5, the axis BB separates, on the left a variant of the clip with offset boss 21 and on the right of the Figure a bearing arm with a flat zone 20.

In FIG. 2, the axis CC represents approximately the axis along which hooks 16 bear on the corresponding zone of the base. When the flat part 20 of the bearing arm 28 comprises a boss 21, this latter is offset by a distance D with respect to the axis CC. It can then be seen that the bearing force of the clip on the chip carrier is thus very substantially increased (by a factor of 2 or 3).

The gain obtained on the total bearing force by offsetting the bearing point allows:
  the width of the arms to be correspondingly reduced, so as to free as much as possible the central opening of the clip required for passing therethrough a cooling device such as a heat-sink;
  the chip carrier to be connected to a base 2 having a high number of contacts 3 themselves having a high individual bearing force for providing a low and stable electric contact resistance.

It should also be noted that the "equal resistance" form of the cut out of the bearing arms 28 (sides 23, 24 are rectilinear) reduces to a maximum the length of these arms while optimizing the distribution of the stresses generated by the total bearing force. Thus, the external space requirement of the connector (top view, see FIG. 1a) is small for a given format of the chip carrier 5.

An advantageous variant of the invention consists in preforming the cross arm 25, during manufacture of the part, so as to give it a slightly curved shape in the form of a bow, bent in the direction opposite the force resulting from the closing of the clip. The cross arms 25 are in the same plane as the clip frame when the clip 1 is not attached to the base 2. When the clip is attached, due to the pressure at both ends of the cross-arms 25, the cross-arms are deformed so that there is a rising in the middle of the cross-arms. Due to this rising, the total height of the system rises. To avoid this drawback, of increased size, the cross-arms are slightly curved in the direction opposite to this deformation. By suitably choosing the prestress of the two cross arms 25, it is possible to establish on the chip carrier an additional bearing point in the middle of each of these two cross arms. These additional two bearing points are added to the two main bearing points 7 exerted by bearing arms 28 and are situated on the second "symmetrical axis, shown as line A—A in FIG. 2, of the chip carrier 5. Because of the profiled shape of the bearing arms 28 (see FIG. 1b), these additional bearing points 29 are offset towards the internal edge 27 of the cross arms 25. This variant may therefore be used also with inexpensive chip carriers having connecting studs on both their faces. Furthermore, as shown in FIG. 6, the central opening in the clip allows a cooling device 30 to be passed therethrough so as to bear directly on the chip-carrier 5. The cooling device is, in the embodiment shown, formed by a heat-sink with vertical fins 32 comprising two horizontal fixing flanges 31, this type of heat-sink is generally formed by an extruded section. The heat-sink must be positioned so that the fins 32 are parallel to the blowing direction. Thus, when the blowing direction is perpendicular to the support arms 28, namely when the blowing is in direction $V_1$, the heat-sink is positioned so that the horizontal flanges 31 are held in position by the cross arms 25. In this case, if the cross arms are curved, the clip exerts a pressure on the chip-carrier 5 not only through the support arms 28 but also through the cross arms 25 bearing on flanges 31, as is shown symbolically by the thick vertical arrows f and f'. Thus, a uniform pressure on the chip carrier on the peripheral electric contacts of the base is obtained. If the blowing direction is parallel to the support arms 28, namely if blowing is in direction $V_2$, the heat-sink is then positioned so that the horizontal flanges 31 are held in position by the support arms 28 as shown at the right hand part of FIG. 6. In a variant, the vertical fins are surrounded by a peripheral flange 31' which provides moreover an improved heat-contact. This embodiment is shown on the left-hand part of FIG. 6. Furthermore, for maintaining the heat-sink on the dismantled clip, either grooves 36 or notches 37 provided on the heat-sink are used to receive the tips 28A, of the support arms 28 to obtain a snap-fit of these parts into the grooves or the notches, as shown in FIG. 6. The tip of the support zone may snap-fit into these parts. The lateral faces of the heat-sink are sloped so as to facilitate snap-fitting of the tips into these grooves or notches. It is then possible with this type of connector to use a single type of heat-sink whatever the blowing direction.

In FIG. 7 is shown another type of cooling device 30. This cooling device is formed from several horizontal fins 33 obtained by machining a cubic or cylindrical part. The fins end in a base 34 dimensioned so as to be able to fit into the central opening of clip 1. In this case, the clip is modified so that each support arm 28 comprises a stud 35 on the external edge of the support zone. This stud may be formed at the same time as the corresponding support arm or formed by an added part, preferably welded to the support arm. The studs and at least one of the fins are provided with orifices 38, for example, threaded, for securing the heat-sink to the clip by means of screws 39. Other fixing means known to a man skilled in the art may be used.

The present invention also relates to a device for snap-fitting the clip on the base. As shown in FIG. 8, this device f is formed by a lid 40 able to be fitted on the base of the connector. Bosses 41 are provided inside the lid at the four corners. These bosses are intended to come into abutment against the four angles of the clip during snap-fitting. Preferably, this snap-fitting device 40 is molded from plastic material. In a variant, an opening may be provided in the central part of the bottom of the lid for passing a heat-sink therethrough.

The present invention may also be used with chip carriers having double rows of alternating peripheral studs or having contacts over the whole of one of its faces. The subject connector is suitable for chip carriers with contact zones or connections disposed peripherally over one and/or both faces as well as those having connections over all or part of the surface of their lower face, with or without connections on their upper face. The base of the subject invention would of course be provided with the number of flexible contacts required for providing the electrical connection with the corresponding contact zones or connections of the chip carrier.

What is claimed is:

1. A connector for a chip carrier comprising: a rectangular base having four corners with a clip housing disposed at each of said four corners, said base being adapted to contact a chip carrier having first and second faces, with electrical contact zones disposed on at least one of said faces, said base having flexible contacts which are adapted to receive corresponding contact zones on the first face of said chip carrier; and a clip adapted to bear on the second face of said chip carrier so as to maintain electric continuity between said contact zones and said flexible contacts, said clip including a rectangular frame having four corners, said frame being substantially in one plane when said clip bears on said chip carrier, said frame having two cross arms forming opposite sides of said rectangular frame, said frame having at least two bearing arms forming opposite sides of said rectangular frame, being connected together by said cross arms, each of said bearing arms including a bearing zone substantially in the middle thereof and two symmetrical half arms connecting to said bearing zone, each of said half arms generally widening in the vicinity of said bearing zone, so as to impart substantially equal resistance to bending along each half arm, each pair of half arms forming an angle out of said plane of said frame when said clip is not bearing on said chip carrier, said bearing zone being disposed at the vertex of said angle and oriented to compressibly contact said chip carrier when said clip is bearing on said chip carrier, and hooks for removably fixing said clip to said rectangular base, one of said hooks being disposed at each of said four corners of said rectangular frame to correspondingly engage each of said clip housings of said base.

2. A connector as claimed in claim 1, wherein said clip is removably fixed to said rectangular base by flexible hooks which correspondingly engage said clip housings by temporarily expanding and then releasing so as to snap-fit onto said clip housings.

3. A connector as claimed in claim 1, wherein each of said bearing arms has an internal edge and each of said bearing zones has a projecting member situated on said internal edge causing increased bearing force of said bearing arm to be exerted on said chip carrier.

4. A connector as claimed in claim 1, wherein said cross arms of said frame have a bowed shape, curving in the same general direction as said angle of said bearing arms, each of said cross arms having an internal edge and each of said cross arms being offset toward said internal edge such that said internal edge at the apex of said bowed cross arm presents a bearing point of said cross arm on said chip carrier.

5. A connector as claimed in claim 1 wherein each of said bearing zones of each of said bearing arms has an external edge having a stud-like member for fixing a cooling device.

6. A connector for a chip carrier comprising:

a rectangular base having four corners with a clip housing disposed at each of said corners, said base being adapted to contact a chip carrier having first and second faces, with electrical contact zones disposed on at least one of said faces, said base having flexible contacts which are adapted to receive corresponding contact zones on the first face of said chip carrier; and a clip adapted to bear on the second face of said chip carrier so as to maintain electric continuity between said contact zones and said flexible contacts, said clip including a rectangular frame having four corners, said frame having two cross arms being substantially in one plane when said clip bears on said chip carrier, forming opposite sides of said rectangular frame, and said frame having at least two bearing arms forming opposite sides of said rectangular frame, being connected together by said cross arms, each of said bearing arms being including a bearing zone substantially in the middle thereof and two symmetrical half arms connecting to said bearing zone, each of said bearing arms having an internal edge and each of said bearing zones having a projecting member situated on said internal edge causing increasing bearing force of said bearing arm to be exerted on said chip carrier, each of said half arms generally widening in the vicinity of said bearing zone so as to impart substantially equal resistance to bending along each half arm, each pair of half arms forming an angle out of said plane of said frame when said clip is not bearing on said chip carrier, said bearing zone being disposed at the vertex of said angle and oriented to compressibly contact said chip carrier when said clip is bearing on said chip carrier, hooks for removably fixing said clip to said rectangular base, one of said hooks being disposed at each of said four corners of said rectangular frame to correspondingly engage each of said clip housings of said base.

7. A connector as claimed in claim 6, wherein said clip is removably fixed to said rectangular based by flexible hooks which correspondingly engage said clip housings by temporarily expanding and then releasing so as to snap-fit onto said clip housings.

8. A connector as claimed in claim 6, wherein said cross arms of said frame have a bowed shape, curving in the same general direction as said angle of said bearing arms, each of said cross arms having an internal edge and each of said cross arms being offset toward said internal edge such that said internal edge at the apex of said bowed cross arm presents a bearing point of said cross arm on said chip carrier.

9. A connector as claimed in claim 6 wherein each of said bearing zones of each of said bearing arms has an external edge having a stud-like member for fixing a cooling device.

* * * * *